(12) United States Patent
Fujimoto

(10) Patent No.: US 6,498,050 B2
(45) Date of Patent: Dec. 24, 2002

(54) BIPOLAR TRANSISTOR, SEMICONDUCTOR LIGHT EMITTING DEVICE AND SEMICONDUCTOR DEVICE

(75) Inventor: Hidetoshi Fujimoto, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/950,629

(22) Filed: Sep. 13, 2001

(65) Prior Publication Data

US 2002/0031853 A1 Mar. 14, 2002

(30) Foreign Application Priority Data

Aug. 30, 2001 (JP) ........................................ 2001-261182
Sep. 13, 2001 (JP) ........................................ 2000-277816

(51) Int. Cl.⁷ ............................................. H01L 21/00
(52) U.S. Cl. ........................................ 438/48; 438/767
(58) Field of Search .......................... 438/46, 48, 309, 438/315, 320, 321, 767

(56) References Cited

U.S. PATENT DOCUMENTS 5,668,048 A * 9/1997 Kondo et al.

FOREIGN PATENT DOCUMENTS

| JP | 9-307100 | 11/1997 |
| JP | 2000-164852 | 6/2000 |

\* cited by examiner

*Primary Examiner*—David Nelms
*Assistant Examiner*—Phuc T Dang
(74) *Attorney, Agent, or Firm*—Oblon, Spivak, McClelland, Maier & Neustadt, P.C.

(57) ABSTRACT

In a GaAs type semiconductor device, $In_pGa_{1-p}N$ ($0 < p \leq 1$) is used to thereby form heterojunction having a large difference in energy gap, thereby providing a high performance semiconductor device.

10 Claims, 4 Drawing Sheets

BIPOLAR TRANSISTOR, SEMICONDUCTOR LIGHT EMITTING DEVICE AND SEMICONDUCTOR DEVICE

CROSS-REFERENCE TO RELATED APPLICATIONS

This application is based upon and claims the benefit of priority from the prior Japanese Patent Application No. 2000-277816, filed on Sep. 13, 2001, and No.2001-261182, filed on Aug. 30, 2001, the entire contents of which are incorporated herein by reference.

BACKGROUND OF THE INVENTION

1. Field of the Invention

The present invention relates to a bipolar transistor, a semiconductor light emitting device and a semiconductor device.

2. Related Background Art

GaAs, which is a III-V compound semiconductor, type transistors have various superior characteristics such as high operating frequency, low noise, high output, high gain, low operating voltage, high operating efficiency and low power consumption compared with Si transistors. Owing to these characteristics, GaAs type heterojunction bipolar transistors (hereinafter referred to as "HBT") and GaAs type high electron mobility transistor (hereinafter referred to as "HEMT") have been already put to practical use as mobile communication devices or the like.

Among these GaAs type transistors, the GaAs type HBT can be driven using a smaller number of power sources than the GaAs type HEMT and is therefore suitable for the miniaturization of system. Also, GaAs type HBT uses ballistic conduction of "hot electrons" injected to a collector and hence has high speed operability. For this, the GaAs type HBT is expected largely to be a key device for supporting the communications using mobile tools such as portable telephones.

The portable telephone and the like generally require a micro-power amplifier ensuring high current gain by using an operation voltage as low as about 4.7 V or about 3.5 V. However, higher current gain is demanded of conventional GaAs type HBTs. Specifically, the same GaAs layer that is used for a base layer is conventionally used for an emitter layer, giving rise to the problem of reduced current gain because of the occurrence of inverse injection from the base layer to the emitter layer.

As a method of solving this problem, a bipolar transistor using an InGaP layer for the emitter layer is proposed in, for example, Japanese Patent Application Laid-Open No. 11-274167. This is an invention that InGaP having a larger bandgap than GaAs is used as the emitter layer to thereby decrease the aforementioned inverse injection. However, even the use of InGaP did not succeed in reducing much inverse injection because the bandgap was not large enough yet.

Also, in Japanese Patent Application Laid-Open No. 9-307100, a method using a wide gap semiconductor is proposed as a method for heightening dielectric resistance between a gate and a drain in a GaAs type HEMT. This is a method in which as wide bandgap semiconductor such as SiC or InAlGaN having a wider bandgap than the aforementioned InGaP is used for an supply layer in a GaAs type HEMT. However, the supply layer in HEMTs is a layer for supplying electrons to a high purity GaAs layer and therefore it is only required for the layer to have a film thickness of tense of nanometers. On the contrary, an n-type emitter layer in the GaAs type HBTs is one of layers constituting an npn junction in a transistor. So, the film thickness of the emitter layer must be about hundreds of nanometers to confine positive holes within a p-type base layer. For this, it is considered to be difficult to form a wide gap semiconductor as the emitter layer of the GaAs HBTs in the same method as in the case of the GaAs type HEMTs.

In light of this, the inventor of the present invention has attempted various experiments to raise the current gain of a GaAs type HBT by forming a heterojunction having a large difference in bandgap between an emitter layer and a base layer. As a result, the inventor has found independently that a HBT having high current gain can be obtained by using InGaN or InN for an emitter layer in a GaAs type HBT. Also, as a result of further experiments repeated by the inventor, it has been found that with regard to GaAs type semiconductor light emitting devices and the like, a high performance device can be obtained using such a method of forming a heterojunction having a large difference in bandgap.

BRIEF SUMMARY OF THE INVENTION

The present invention has been conducted to solve the aforementioned problems and it is an object of the present invention to provide a higher performance semiconductor device by forming a heterojunction having a large difference in bandgap.

According to a first aspect of an embodiment of the present invention, there is provided a bipolar transistor comprising:

a substrate;

a collector layer with first conductive type formed on said substrate;

a base layer with second conductive type formed on said collector layer and made of a material selected from the group consisting of GaAs, InGaAs, AlGaAs, InAlGaP, InGaAsP, GaSb, GaAsSb, GaNAs, InGaNAs, SiGe, and HgCdTe; and an emitter layer with first conductive type formed on said base layer and made of $In_pGa_{1-p}N$ (0<p≦1), the emitter layer having a larger bandgap than said base layer.

According to another aspect of an embodiment of the present invention, there is provided a semiconductor light emitting device comprising:

A semiconductor light emitting device comprising:

a first conductive type clad layer;

an active layer formed on said first conductive type clad layer and made of $In_bAl_cGa_{1-b-c}As_dP_{1-d}$ (0≦b≦1, 0≦c≦1, 0≦b+c≦1 and 0≦d≦1), the active layer emitting light by the injection of current; and a second conductive type clad layer formed on said active layer and made of $In_rGa_{1-r}N$ (0<r≦1).

According to a further aspect of an embodiment of the present invention, there is provided a semiconductor device comprising:

a first semiconductor layer made of $In_tGa_{1-t}N$ (0<t≦1) and a second semiconductor layer which forms heterojunction with the aforementioned first semiconductor layer, has higher electron affinity than the aforementioned first semiconductor and contains a material selected from the group consisting of GaAs, InGaAs, AlGaAs, InAlGaP, InGaAsP, GaSb, GaAsSb, GaNAs, InGaNAs, SiGe and HgCdTe.

DETAILED DESCRIPTION OF THE INVENTION

Embodiments according to the present invention will be hereinafter explained with reference to the drawings. The following explanations will be made as to a GaAs type heterojunction bipolar transistor in a first embodiment, as to a GaAs type light emitting diode in a second embodiment, as to a GaAs type laser diode in a third embodiment and as to a GaAs type HEMT in a fourth embodiment.

(First Embodiment)

Figure 1:
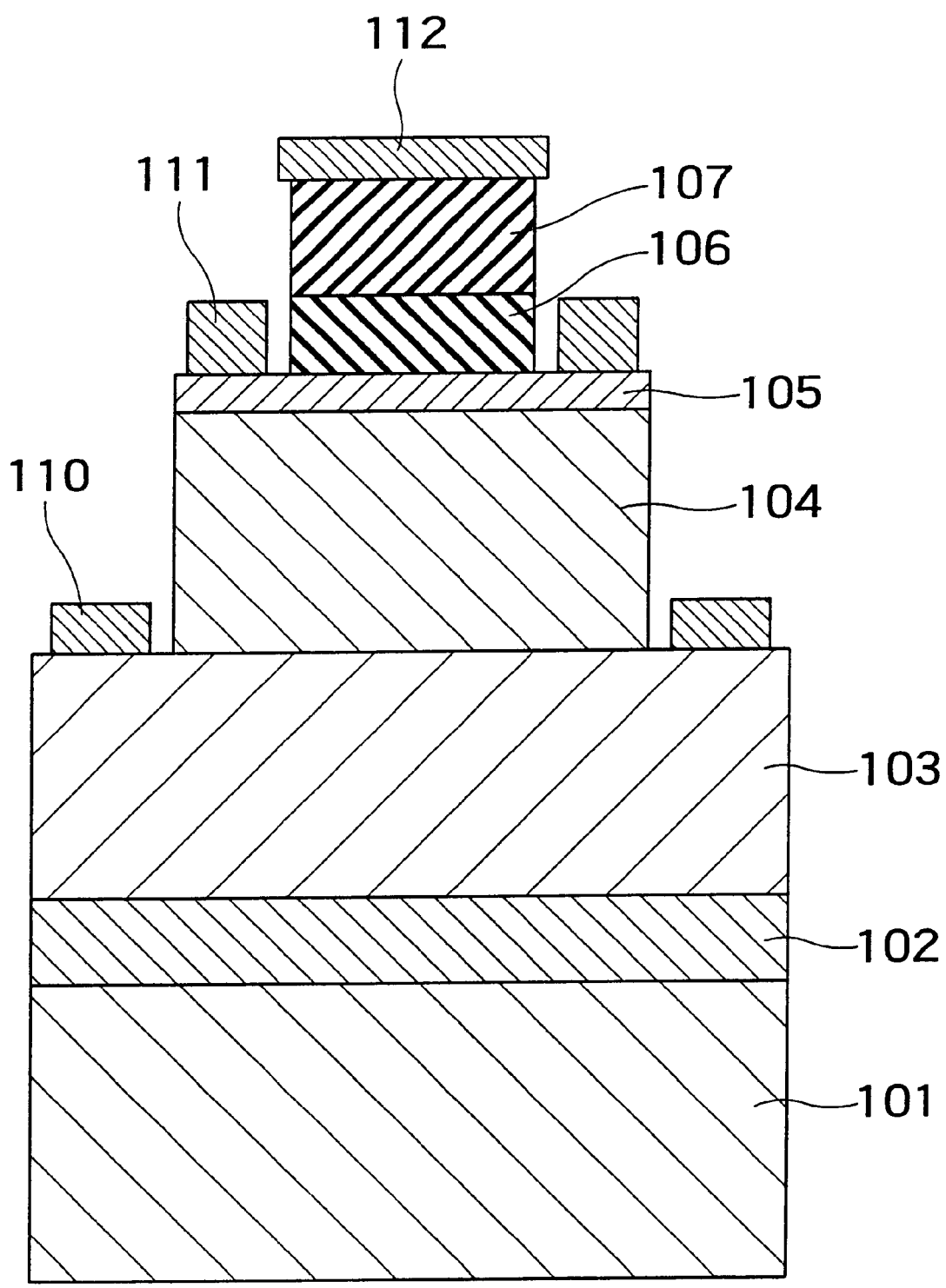
FIG. 1 is a schematic sectional view of a bipolar transistor of a first embodiment according to the present invention.

One of the characteristics of the bipolar transistor of the first embodiment resides in the use of InGaN for an emitter layer 106 and an emitter contact layer 107 in a GaAs type device as is clear from FIG. 1.

FIG. 1 is a schematic sectional view of the bipolar transistor of the first embodiment according to the present invention. On an SI-GaAs substrate (semi-insulating GaAs substrate) 101 having a thickness of hundreds of μm, a buffer layer 102 made of undoped GaAs, a collector contact layer 103 comprising high density n-type GaAs and having a film thickness of 450 nm, a collector layer 104 made of n-type GaAs and having a film thickness of 700 nm and a base layer 105 comprising p-type GaAs and having a thickness of 60 nm are formed in this order. In the following explanations, these layers are called GaAs layers 101 to 105 as the case may be. On the base layer 105, an emitter layer 106 made of n-type $In_{0.5}Ga_{0.5}N$ and an emitter contact layer 107 made of compositional grading n-type InGaN are formed in this order. The sum of the film thicknesses of the emitter layer 106 and emitter contact layer 107 was designed to be 300 nm.

Current and voltage are applied to the emitter layer 106 from an emitter electrode 112 through the emitter contact layer 107. Here, the In composition in the emitter contact layer 107 is designed to be increased toward the emitter electrode 112 to make it easy to make ohmic contact between the emitter electrode 112 and the emitter layer 106. Also, current and voltage are applied to the base layer 105 from a base electrode 111. Also, current and voltage are applied to the collector layer 104 from a collector electrode 110 through the collector contact layer 103. The bipolar transistor shown in FIG. 1 has an npn junction structure in which the p-type base layer 105 and the n-type emitter layer 106 are joined in this order on the n-type collector layer 104 and acts as a transistor by applying predetermined voltage and current to each layer in the same way as in the case of common transistors.

The bipolar transistor shown in FIG. 1 is a heterojunction bipolar transistor (HBT) in which the base layer 105 comprising GaAs is joined with the emitter layer comprising InGaN. Also, the HBT shown in FIG. 1 is a GaAs type HBT formed using the GaAs substrate 101. The size of the bipolar transistor shown in FIG. 1 is changed in magnification for the sake of convenient explanations.

Next, a process of producing the bipolar transistor shown in FIG. 1 will be explained.

(1) First, an SI-GaAs substrate 101 is placed on a susceptor and heated to about 700° C. Then, TMG (trimethylgallium), $AsH_3$ and hydrogen carrier gas are allowed to flow to grow the buffer layer 102 made of undoped GaAs. In this case, the crystal structure of GaAs is a zincblende structure.

(2) Next, TMG (trimethylgallium), $AsH_3$ and $SiH_4$ as an n-type doping material and hydrogen carrier gas are allowed to flow while the temperature of the substrate is kept at 700° C. to grow the collector contact layer 103 and collector layer 104 made of n-type GaAs.

(3) Next, the substrate is cooled to 520° C. and TMG (trimethylgallium), $AsH_3$ and hydrogen carrier gas are allowed to flow to grow the base layer 105 comprising p-type GaAs. Here, the raw material supply ratio $AsH_3$/TMG is designed to be 1 or less. It is to be noted, $CBr_4$, TMAs (trimethylarsenic) or the like may be used as the p-type doping material.

(4) Next, the substrate is heated to 700° C. and TMG, TMI (trimethylindium), $NH_3$, $SiH_4$ as an n-type doping material and carrier gas are allowed to flow to grow the emitter layer 106 and emitter contact layer 107 comprising n-type InGaN. Here, dimethylhydrazine may be used in place of $NH_3$. In this case, each crystal structure of the n-type InGaAs of both of the emitter layer 106 and the emitter contact layer 107 is a zincblende structure.

(5) Next, the substrate 101 is cooled to ambient temperature and taken out. After etching is carried out such that the substrate is made into such a shape as shown in FIG. 1. Thereafter, the collector electrode 110, the base electrode 111 and the emitter electrode 112 are formed.

In the GaAs type HBT formed in the method as explained above with reference to FIG. 1, the base layer 105 comprising GaAs is joined with the emitter layer 106 comprising InGaN through a heterojunction. Therefore, a device having high current gain and stable characteristics can be provided. Specifically, the bandgap of GaAs constituting the base layer 105 is about 1.4 eV whereas the bandgap of $In_{0.5}Ga_{0.5}N$ constituting the emitter layer 106 is about 2.4 eV. Inverse injection of carriers from the base layer 105 to the emitter layer 106 is limited to thereby obtain high current gain by joining semiconductors having a large difference in bandgap through a heterojunction in this manner.

Actually, it has been considered to be very difficult to use materials such as InGaN for the GaAs type HBT in view of crystal growth. This is due to a difference in lattice constants and a difference in growth temperature. These points will be explained in detail.

As semiconductor materials having a wide bandgap, wide gap semiconductors such as GaN, AlGaN, SiC and ZnSe are known. Here, the wide gap semiconductor almost means semiconductors having a bandgap of 2.6 eV or more corresponding to the emission energy of blue light. This wide gap semiconductor largely differs in lattice constant from a GaAs semiconductor. For example, in the case of forming a GaN layer on a GaAs layer, the lattice mismatch is as large as 20.5% because the lattice constant of GaAs (zincblende structure) is 0.565 nm whereas the lattice constant of GaN (zinc blende structure) is about 0.45 nm. In addition to this, when Al is added to the GaN layer, the value of the lattice mismatch is further increased. This value is very large taking it into consideration that the lattice mismatch in a heterojunction between GaAs and AlGaAs which are conventionally used is 1% or less. When a heterojunction is formed using crystals having large lattice mismatch, cracks are easily caused in the crystals. In addition to this, these wide gap semiconductors have smaller lattice constants than GaAs. For this, when the emitter layer 106 and emitter contact layer 107 of the bipolar transistor shown in FIG. 1 are made of a wide gap semiconductor, force is applied to the wide gap semiconductor in the direction of tension. When force is applied in the direction of tension in this manner, cracks are caused more easily than in the case where force is applied in the direction of compression. Moreover, the emitter layer 106 and emitter contact layer 107 of the bipolar transistor shown in FIG. 1 respectively are one layer constituting an npn junction and must have a film thickness of hundreds of nanometers to confine positive holes within the p-type base layer 105. When a film with a thickness of hundreds of nanometers is formed in this manner, cracks are very easily caused different from the case of forming a film with a thickness as thin as tense of nanometers.

Also, usually, the crystal growth temperature of the wide gap semiconductor is extremely high. For example, in a MOCVD method, the growth temperature of GaAs is about 600° C. to 700° C. whereas the growth temperature of GaN is about 1100° C. and the growth temperature of AlGaN is about 1200° C. When the wide gap semiconductor layers 106 and 107 shown in FIG. 1 are formed at such a high temperature, As considerably evaporate from the GaAs layers 101 to 105, each quality of GaAs layers 101 to 105 cannot be maintained. For this, if the wide gap semiconductor layer is grown at lower temperatures of the same order as in the case of GaAs layer to avoid this phenomenon, the crystal structure of the wide gap semiconductor layer is significantly deteriorated in usual.

It has been considered to be very difficult in light of crystal growth to use semiconductors, such as wide gap semiconductors, having a large bandgap for the emitter layer 106 and the emitter contact layer 107 of such a GaAs type HBT as shown in FIG. 1.

In view of this situation, the inventor of the present invention has repeated various experiments to obtain devices having high current gain by using a semiconductor having a high bandgap for the emitter layer 106 and emitter contact layer 107 of the GaAs type HBT. As a result, the inventor has independently found that this problem can be solved by using $In_pGa_{1-p}N$ (0<p≦<1) for the emitter layer 106 and the emitter contact layer 107. The bandgap of this $In_pGa_{1-p}N$ is about 1.9 eV to 3.4 eV, which is larger than that of about 1.4 eV of GaAs. Also, in the case of $In_pGa_{1-p}N$ (0<p≦1), the crystal growth temperature can be lowered to 800° C. or less. Therefore this $In_pGa_{1-p}N$ can be formed even by using an ordinary GaAs type crystal growth apparatus without deteriorating crystal qualities. And this $In_pGa_{1-p}N$ can be formed on the GaAs layers 101 to 105 without evaporating As from the GaAs layers. Also, it was confirmed that the aforementioned cracks did not occur when this $In_pGa_{1-p}N$ was used for the GaAs type HBT. The inventor of the present invention consider to be that its reason is as follows.

One reason is considered to be that the crystal containing In has ductility. The lattice mismatch between GaAs and $In_pGa_{1-p}N$ is the order of 12% or more. When the magnitude of this lattice mismatch is remarked, it is conventionally common technical practice that the formation of an $In_pGa_{1-p}N$ layer having a thickness of hundreds of nanometers on the GaAs layers 101 to 105 having a thickness of several μm is very difficult. According to the experiments made by the inventor, in actual, cracks occurred when InAlGaN having the same lattice constant was used in place of $In_{0.5}Ga_{0.5}N$ for the emitter layer 106. However, according to the experiments made by the inventor, no crack occurred when $In_pGa_{1-p}N$ was used for the emitter layer 106 and the emitter contact layer 107. This is considered to be because the crystal containing In has ductility. It is considered that even if $In_pGa_{1-p}N$ is used for the emitter layer 106 and the emitter contact layer 107, no crack occurs since the crystal containing In has ductility.

Another reason is considered to be that the crystal structure of $In_pGa_{1-p}N$ tends to have a zincblende structure. The aforementioned explanations of the lattice constant were offered on the premise that GaN type materials had zinc blende structures resultantly. This is because each crystal structure of the GaAs layers 101 to 105 shown in FIG. 1 is a zinc blende structure and each crystal structure of the semiconductor layers 106 and 107 to be formed on these GaAs layers tend to have a zinc blende structure. However, the GaN materials usually tend to have a wurtzite structure. Particularly such a tendency is strengthened in the case of AlN, AlGaN, and AlInGaN including Al. Therefore, when a GaN type material layer containing Al is formed on the GaAs layers 101 to 105, the crystal structure tends to have a wurtzite structure. For this, in this case, the GaN type material containing Al and the GaAs layers 101 to 105 tend to have different structures. It is considered that such different structures cause cracks to occur. On the other hand, when $In_pGa_{1-p}N$ is formed on the GaAs layers 101 to 105, it tends to have the same structure as these GaAs layers 101 to 105. It is considered that cracks therefore occur with difficulty.

As outlined above, a device having large current gain can be obtained using $In_pGa_{1-p}N$ for the emitter layer 106 and the emitter contact layer 107.

In the GaAs type HBT shown in FIG. 1 as was explained above, the emitter contact layer 107 is formed on the emitter layer 106 and the sum of these layers' film thickness is designed to be 300 nm. However, if the emitter layer 106 is formed of compositional grading n-type InGaN having a film thickness of 300 nm without forming the emitter contact layer 107 made of n-type InGaN, the product is expected to be similar to the GaAs type HBT shown in FIG. 1.

Also, in the GaAs type HBT shown in FIG. 1, the sum of the film thicknesses of the emitter layer 106 and the emitter contact layer 107 is designed to be 300 nm. However, according to the experiments of the inventor, if this thickness was 200 nm or more, holes could be confined in the base layer 105 and inverse injection could be restricted. However, this thickness varied according to the percentage composition of In in InGaN of the emitter layer 106 and the emitter contact layer 107.

Also, each emitter resistance of the emitter layer 106 and the emitter contact layer 107 may be changed according to the percentage composition of In, film thickness, the carrier density and the like as required. This allows the emitter contact layer to conform with peripheral circuits.

Also, in the GaAs type HBT shown in FIG. 1, InGaN is used as the material of the emitter layer 106 and the emitter contact layer 107. However, InGaN containing Ta can be used. And InGaN containing small quantity of B, As or P can be used.

Also, in the GaAs type HBT shown in FIG. 1, GaAs is used as the material of the base layer 105. However, III-V group crystals mixed with In such as InGaAs, InAlGaP and InGaAsP or III-V group crystal mixed with Sb such as GaAsSb and GaAs can be used. In the case of using these mixed crystals, a difference in bandgap between the emitter layer 106 and the base layer 105 can be increased whereby turn-on voltage can be lowered. Also, as the material for the base layer 105, III-V group crystals mixed with nitrogen for example, InGaNAs and GaAsN may be used. In this case, the ratio of nitrogen to be mixed in a crystal must be 2% or less. This is because the mixed crystals of nitrogen has a wider energy gap than GaAs in general. Also, it is possible to use AlGaAs, SiGe or HgCdTe as the material of the base layer 105. Also, the aforementioned materials may be used for the collector layer 104 and the collector contact layer 103.

Also, because the corner sections of each layer of the GaAs type HBT shown in FIG. 1 tend to be deteriorated by the concentration of electric field, a projecting section called a ridge may be formed between respective layers.

Also, in the GaAs type HBT shown in FIG. 1, an etching stop layer may be optionally inserted into a necessary part to ensure stable removal of each layer by etching.

(First Modification)

In a first modification according to the first embodiment, the GaAs type HBT is made into a double heterojunction type. The points modified reside in the use of n-type InGaN for the collector layer 104 in FIG. 1. In the case of using such a material, higher current gain can be obtained. When the collector layer 104 is formed of InGaN in this manner, the following three structures may be adopted as the structures of from the substrate 101 to the collector contact layer 103.

In a first method, SI-GaAs is used for the substrate 101, GaAs is used for the buffer layer 102 and n-type GaAs or n-type InGaN is used for the collector contact layer 103 in the same manner as in the first embodiment. This method may use GaAs having a large diameter as the substrate.

In a second method, the crystal qualities of the InGaN layers 103 and 104 are more improved based on the first method and the buffer layer 102 is divided into a first GaAs buffer layer and a second GaN buffer layer. In this method, the second GaN buffer layer is desirably a layer with a level enabling the surface of GaAs to be nitrided. Also, the collector contact layer 103 is desirably an n-type InGaN layer.

A third method is the case where, as the substrate 101, a material, such as sapphire and SiC, which is originally used frequently in a process of GaN type crystal growth is used and a nitride layer comprising GaN, AlN, InN or the like is used as the buffer layer. In this case, also, the collector contact layer 103 is desirably made of n-type InGaN to further improve crystal qualities. In this case, the crystal structure of InGaN used in the collector layer 104 and the collector contact layer 103 is a wurtzite structure whereas the crystal structure of InGaN used in the emitter layer 106 and the emitter contact layer 107 is a zincblende structure. This makes it possible to make use of a difference in energy gap due to a difference in crystal structure.

(Second Modification)

In a second modification according to the first embodiment, the base layer 105 is made of p-type InGaNAs. Because this material system has smaller bandgap energy than InGaAs depending on the content of nitrogen (N), a low voltage operation can be expected. The mixed crystal ratio of nitrogen (N) based on the total V group elements is desirably 2% or less. On the other hand, the mixed crystal ratio of In based on the total III group elements is 0.5.

(Third Modification)

In a third modification according to the first embodiment, the emitter contact layer 107 is designed to have a structure in which n-type InGaP, n-type GaAs and n-type InGaAs are formed in this order. Each bandgap of n-type InGaP, n-type GaAs and n-type InGaAs descends in this order. Therefore, the use of this emitter contact layer make it easy to establish ohmic contact between the emitter electrode 112 and the emitter layer 106. In this case, force is applied to InGaN of the emitter layer 106 in the direction of tension also from the upper side in the figure. However, the occurrence of cracks was not observed.

(Second Embodiment)

A second embodiment relates to a semiconductor light emitting device to which the present invention is applied. As is understood from FIG. 2, a p-type clad layer 223 comprising p-type InGaN is used for a GaAs type LED (Light Emitting Diode).

Figure 2:
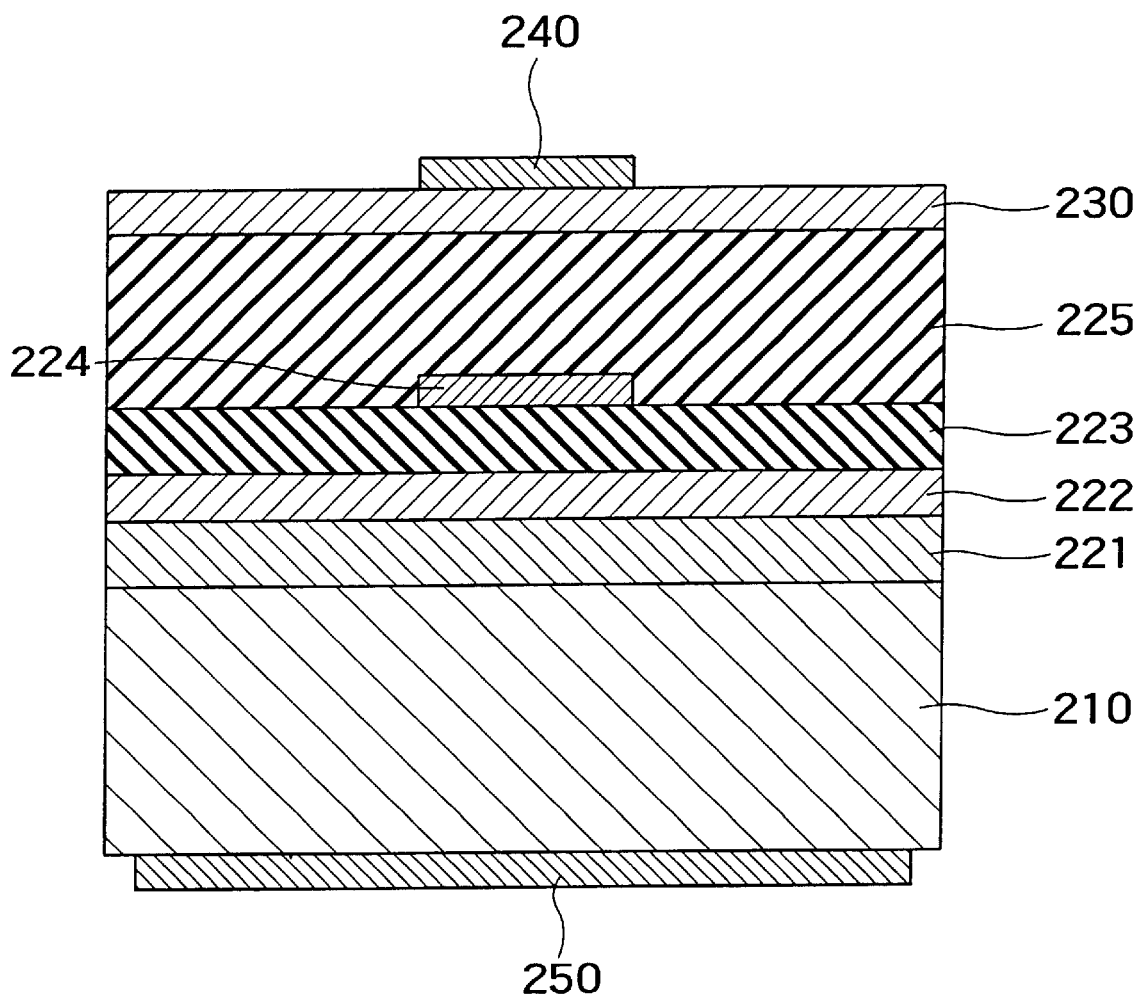
FIG. 2 is a schematic sectional view of a semiconductor light emitting device of a second embodiment according to the present invention.

FIG. 2 is a view of a sectional structure of a semiconductor light emitting device of a second embodiment according to the present invention. This semiconductor light emitting device is a GaAs type LED formed using a substrate 210 comprising n-type GaAs and having a thickness of 250 $\mu$m. On the substrate 210, an n-type clad layer 221 made of n-In$_{0.5}$(Al$_{0.6}$Ga$_{0.4}$)$_{0.5}$P and having a film thickness of 1.0 $\mu$m, a light emitting layer 222 made of In$_{0.5}$(Al$_{0.4}$Ga$_{0.6}$)$_{0.5}$P and having a film thickness of 1.0 $\mu$m, a p-type clad layer 223 made of p-In$_{0.2}$Ga$_{0.8}$N and having a film thickness of 200 nm, a current blocking layer 224 made of n-GaAs, a p-type buried layer 225 made of p-In$_{0.2}$Ga$_{0.8}$N and a p-type contact layer 230 made of p-GaAs are formed in this order. In addition, an n-side electrode 250 is formed on the substrate 210 on the lower side of the figure and a p-side electrode 240 on the p-type GaAs contact layer 230 on the upper side of the figure. Here, it is general that a Au—Zn alloy is used for the p-side electrode 240 and a Au—Ge alloy is used for the n-side electrode 250. Each size of these parts shown in FIG. 2 is changed in magnification for the sake of convenient explanations.

In the GaAs type LED shown in FIG. 2, current is injected into the light emitting layer 222 from the n-side electrode 250 and the p-side electrode 240. In this case, the n-type clad layer 221 and the p-type clad layer 223 respectively have larger bandgap energy than the light emitting layer 222 and work to confine carriers within the light emitting layer 222.

In the GaAs type LED shown in FIG. 2, In$_{0.2}$Ga$_{0.8}$N having a wider bandgap is used for the p-type clad layer 223. Therefore, the overflow of carriers from the light emitting layer 222 can be limited and therefore the GaAs type LED shown in FIG. 2 can be more improved in light emission efficiency by about 30% than a conventional GaAs type LED.

On the other hand, conventionally, In$_{0.5}$(Al$_{0.6}$Ga$_{0.4}$)$_{0.5}$P having a lower bandgap than In$_{0.2}$Ga$_{0.8}$N is used for the p-type clad layer 223. The lattice constant of In$_{0.5}$(Al$_{0.6}$Ga$_{0.4}$)$_{0.5}$P is close to the lattice constant (0.565 nm) of GaAs constituting the substrate 210 and the lattice mismatch is 1% or less. However, because the bandgap of In$_{0.5}$(Al$_{0.6}$Ga$_{0.4}$)$_{0.5}$P is relatively close to that of In$_{0.5}$(Al$_{0.4}$Ga$_{0.6}$)$_{0.5}$P constituting the light emitting layer 222, electrons are overflowed from the light emitting layer 222. It has been considered to be very difficult in light of lattice conformity and crystal growth temperature to use a material having a larger bandgap energy than In$_{0.5}$(Al$_{0.6}$Ga$_{0.4}$)$_{0.5}$P for the p-type clad layer 223 as explained in the first embodiment. Particularly, in light emitting diodes as shown in FIG. 2, the film thickness of the p-type clad layer 223 must be hundreds of nanometers to restrict the overflow of carriers from the light emitting layer 222. In order to grow a crystal having such a thickness, it has been considered to be essential to use a material having a lattice constant close to that of GaAs or In$_{0.5}$(Al$_{0.4}$Ga$_{0.6}$)$_{0.5}$P. However, the inventor of the present invention has found independently from experiments that In$_r$Ga$_{1-r}$N (0<r$\leq$1) can be used for the p-type clad layer 223. From the analysis made by the inventor, this reason is assumed to be the same as that explained in the first embodiment.

In the aforementioned semiconductor light emitting device shown in FIG. 2, the film thickness of the p-type clad layer 223 is designed to be 200 nm. However, according to the experiments made by the inventor, the effect of improving light emitting efficiency is obtained if the film thickness is about 100 nm or more.

Also, in the semiconductor light emitting device shown in FIG. 2, $In_{0.5}(Al_{0.6}Ga_{0.4})_{0.5}P$ is used for the n-type clad layer 221. However, InGaN may be used for the n-type clad layer 221. In this case, the effect of limiting the overflow of electrons from the light emitting layer 222 is made higher. However, the crystal characteristics are deteriorated caused by lattice mismatch and the light emitting efficiency is therefore the same level as that of the semiconductor light emitting device shown in FIG. 2.

Also, in the semiconductor light emitting device shown in FIG. 2, the GaAs substrate 210 may be removed after the device is formed and also, a multilayer reflecting film comprising AlP/GaP or the like may be interposed between the substrate 210 and the clad layer 221. Such measures ensure that light absorption by the GaAs substrate 210 can be prevented to thereby obtain a semiconductor light emitting device having high light emitting efficiency.

(Third Embodiment)

A third embodiment relates to a laser diode (LD) as a semiconductor light emitting device to which the present invention is applied. As is understood from FIG. 3, an n-type InGaN clad layer 303 and a p-type InGaN clad layer 309 are used for a GaAs type LD.

Figure 3:
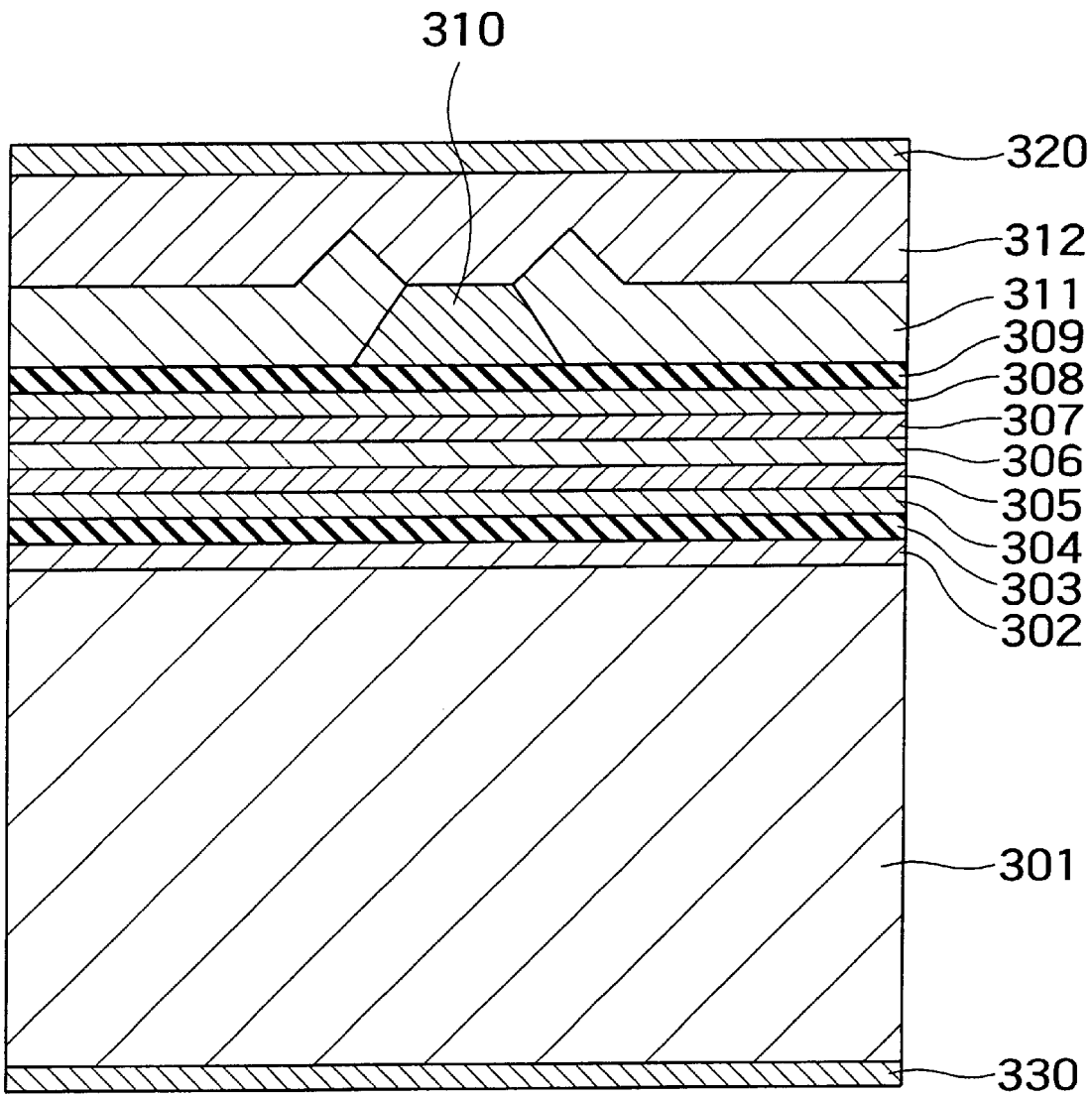
FIG. 3 is a schematic sectional view of a semiconductor light emitting device of a third embodiment according to the present invention.

FIG. 3 is a view of the sectional structure of a semiconductor light emitting device of a third embodiment according to the present invention. This semiconductor light emitting device is a GaAs type LD formed using a substrate 301 made of n-type GaAs. On the substrate 301, a buffer layer 302, a first n-type clad layer 303 made of n-type InGaN, a second n-type clad layer 304 made of n-type InAlGaP, a first guide layer 305 made of InAlGaP, an active layer 306 made of InAlGaP/InAlGaP with an MQW structure, a second guide layer 306 made of InAlGaP, a first p-type clad layer 308 made of p-type InAlGaP and a second p-type clad layer 309 made of p-type InGaN are formed in this order. In addition, a third clad layer 310 made of p-type InAlGaP and a current blocking layer 311 made of n-type GaAs are selectively formed on the second p-type clad layer 309. On these layers, a p-type contact layer 312 made of p-type GaAs is formed. A p-side electrode 320 which is one of a pair of electrodes is formed on the p-type contact layer 312 on the upper side of the figure and an n-side electrode 330 which is the other electrode is formed on the substrate 301 on the lower side of the figure. In this case, the crystal structure of InGaN of the first n-type clad layer 303 and the second p-type clad layer 309 has a zincblende structure.

In the GaAs type LD shown in FIG. 3, current is injected into the active layer 306 from the n-side electrode 330 and the p-side electrode 320. In this case, the n-type clad layers 303 and 304 and the p-type clad layers 308, 309 and 310 respectively have a larger bandgap energy than the active layer 306 and work to confine electrons in the active layer 306. Also, current is not flowed through the current blocking layer 311, and the current blocking layer 311 works to contract current in the active layer 306 disposed under the third clad layer 310. The active layer 306 which is disposed under the third clad layer 310 and into which current is injected radiates laser light with an oscillation wavelength of about 650 nm. At this time, the first guide layer 305 and the second guide layer 307 work to confine laser light in the active layer 306.

In the GaAs type LD shown in FIG. 3, InGaN having a high bandgap energy is used for the first n-type clad layer 303 and the second p-type clad layer 309. Therefore, light and carriers can be confined in the vicinity of the active layer 306 and an LD having a high quantum efficiency can be therefore attained.

On the other hand, conventionally, InAlGaP having a lower bandgap energy than InGaN is used for the first n-type clad layer 303 and the second p-type clad layer 309. This is because it has been considered to be very difficult in light of lattice conformity and crystal growth temperature to use a material having a larger bandgap energy than InGaAlP in the same manner as in the second embodiment. However, the inventor of the present invention has found independently from experiments that $In_sGa_{1-s}N$ ($0 < s \leq 1$) can be used for the p-type clad layer. From the analysis made by the inventor, this reason is assumed to be the same as that explained in the first embodiment.

Although InAlGaP is used for the active layer 306 in the above-explained semiconductor light emitting device shown in FIG. 3, a different material may be used corresponding to the oscillating wavelength. For example, InGaP when the oscillating wavelength is 680 nm, AlGaAs when the oscillating wavelength is 780 nm, GaAs when the oscillating wavelength is 860 nm and InGaAs when the oscillating wavelength is 980 nm may be used. All of these materials can be formed on the GaAs substrate 301.

Although GaAs is used for the substrate 301 in the semiconductor light emitting device shown in FIG. 3, GaN may be used. In this case, each crystal structure of the substrate 301, the buffer layer 302 and the first clad layer 303 is a wurtzite structure and the layer on the upper side than the first n-type clad layer 303 in the figure has a zincblende structure. In this structure, the crystal structure of the first n-type clad layer 303 is different from that of the second p-type clad layer 309. Therefore, the characteristics of the laser can be improved by making use of these differences in bandgap and in refractive index.

(Fourth Embodiment)

A fourth embodiment relates to a GaAs type HEMT having a double-hetero structure to which the present invention is applied. As is understood from FIG. 4, $In_{0.5}Ga_{0.5}N$ is used for a first supply layer 403 and a second supply layer 405.

Figure 4:
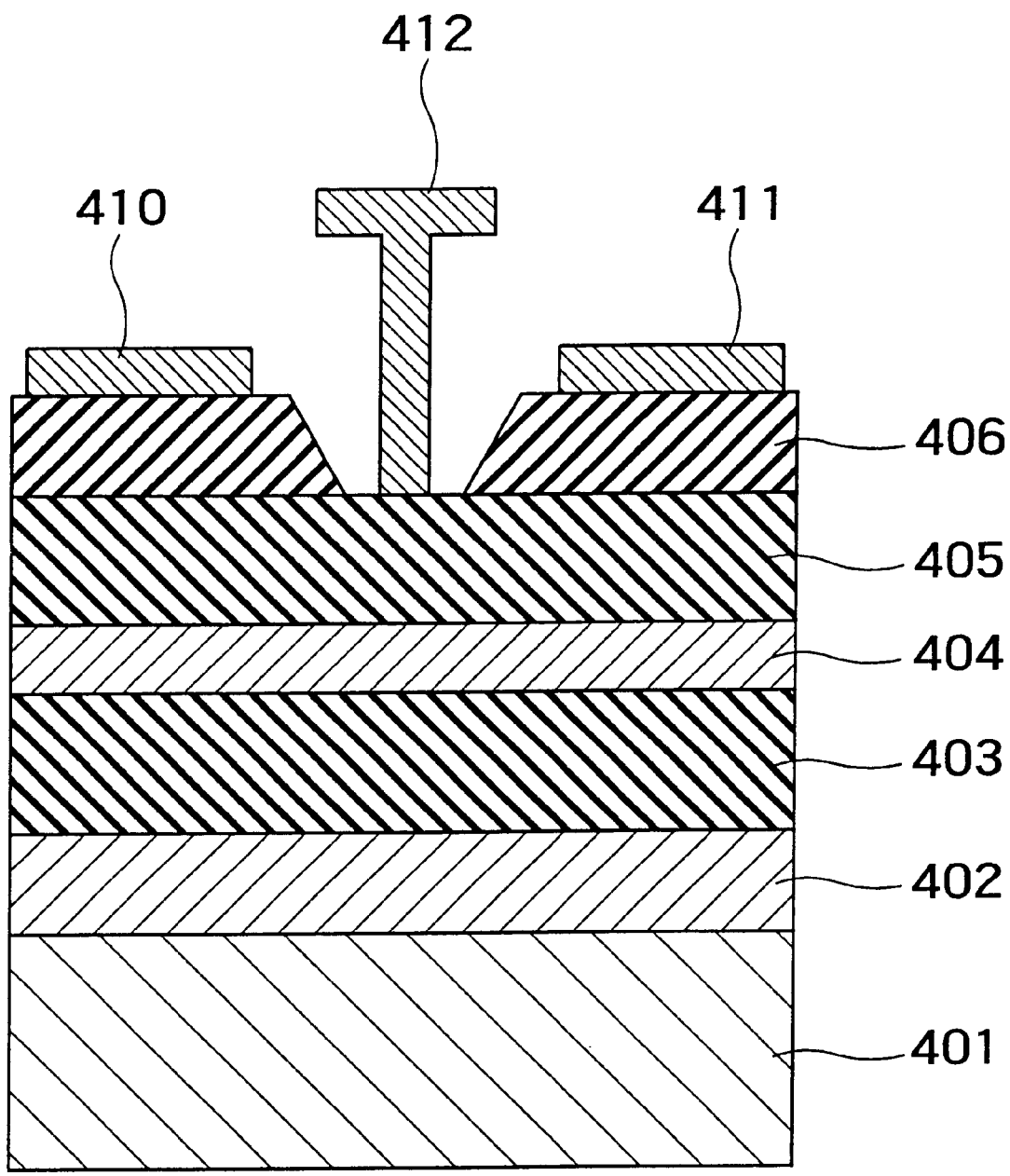
FIG. 4 is a schematic sectional view of a semiconductor device of a fourth embodiment according to the present invention.

FIG. 4 is a view showing a semiconductor device according to the fourth embodiment of the present invention. This semiconductor device is a GaAs type HBT formed using a substrate 401 made of SI-GaAs. On the substrate 401, a buffer layer 402 made of undoped InGaAs, a first supply layer 403 made of undoped InGaN, a channel layer 404 made of undoped InGaAs, a second supply layer 405 made of n-type InGaN and an ohmic contact layer 406 made of n-type InGaN are formed. A source electrode 410 and a drain electrode 411 which are ohmic electrodes and have a laminate structure of Au/Ti are formed in contact with the ohmic contact layer 406. Also, a gate electrode 412 which is a Schottky electrode and has a laminate structure of Au/Ti is formed in contact with the second supply layer 405. The film thickness of the second supply layer 405 is designed to be 30 nm and the film thickness of the ohmic contact layer 406 is designed to be 20 nm.

The semiconductor device shown in FIG. 4 is a field effect transistor having a double hetero structure using two heterojunctions between InGaAs having large electron affinity and InGaN having small electron affinity. In the GaAs type HEMT shown in FIG. 4, electrons are allowed to transit in the channel layer 404 having high electron affinity.

One of the characteristics of GaAs type HEMT shown in FIG. 4 resides in the point that $In_{0.5}Ga_{0.5}N$ having small electron affinity is used for the second supply layer 405 and the first supply layer 403. This makes it possible to increase a difference in electron affinity between the supply layers 403 and 405 and the channel layer 404 in the GaAs type HEMT shown in FIG. 4. As a consequence, many more electrons can be confined by the channel layer 404, making it possible to obtain good pinch-off characteristics, high mutual inductance and high dielectric resistance between the gate and the drain.

In the above-explained GaAs type HEMT shown in FIG. 4, $In_{0.5}Ga_{0.5}N$ is used for the supply layers 403 and 405. In this case, the percentage composition of In in $In_{0.5}Ga_{0.5}N$ may be changed. According to the experiments of the inventor of the present invention, particularly the characteristics of the device were improved when the percentage composition of In in InGaN to be used for the supply layers 403 and 405 was 40% or more. The inventor of the present invention considers that this reason is that the crystal characteristics is more improved as the percentage composition of In is higher in the case of forming a film, such as the supply layers 403 and 405, having a thickness as thin as tens of nanometers.

Although in the HEMT shown in FIG. 4, InGaAs is used for the channel layer, the same effects that are obtained in the present invention are obtained also in the case of using GaAs, AlGaAs, InAlGaP, InGaAsP, GaSb, GaAsSb, GaNAs, InGaNAs, SiGe or HgCdTe.

Although the HEMT having a double hetero structure is explained with reference to FIG. 4, the same effect can also be obtained by an HEMT having a single hetero structure.

What is claimed is:

1. A bipolar transistor comprising:

a substrate;

a collector layer with first conductive type formed on said substrate;

a base layer with second conductive type formed on said collector layer and made of a material selected from the group consisting of GaAs, InGaAs, AlGaAs, InAlGaP, InGaAsP, GaSb, GaAsSb, GaNAs, InGaNAs, SiGe, and HgCdTe; and an emitter layer with first conductive type formed on said base layer and made of $In_pGa_{1-p}N$ ($0<p\leq1$), the emitter layer having a larger bandgap than said base layer.

2. A bipolar transistor according to claim 1, wherein said collector layer is made of a material selected from the group consisting of GaAs, InGaAs, AlGaAs, InAlGaP, InGaAsP, GaSb, GaAsSb, GaNAs, InGaNAs, SiGe, HgCdTe, and InGaN.

3. A bipolar transistor according to claim 1, wherein said substrate is a GaAs substrate.

4. A bipolar transistor according to claim 1, wherein said base layer contains a material selected from the group consisting of GaAs, InGaAs and InGaNAs.

5. A bipolar transistor according to claim 1, wherein the crystal structure of said emitter layer is a zincblende structure.

6. A bipolar transistor according to claim 1, wherein said emitter layer has a thickness of 200 nm or more.

7. A bipolar transistor according to claim 1, the bipolar transistor further comprising an emitter contact layer to easily make ohmic contact between said emitter layer and an emitter electrode.

8. A bipolar transistor according to claim 7, wherein the sum of the thicknesses of said emitter layer and said emitter contact layer is 200 nm or more.

9. A bipolar transistor according to claim 8, wherein said emitter contact layer contains $In_qGa_{1-q}N$ ($p<q\leq1$).

10. A bipolar transistor according to claim 1, wherein said first conductive type is an n-type and said second conductive type is a p-type.

* * * * *

UNITED STATES PATENT AND TRADEMARK OFFICE
CERTIFICATE OF CORRECTION

PATENT NO. : 6,498,050 B2
DATED : December 24, 2002
INVENTOR(S) : Fujimoto

It is certified that error appears in the above-identified patent and that said Letters Patent is hereby corrected as shown below:

<u>Title page,</u>
Item [30], Foreign Application Priority Data, should read:

-- [30]   Foreign Application Priority Data

Aug. 30, 2001   (JP) ............................... 2001-261182
Sep. 13, 2000   (JP) ............................... 2000-277816 --

Signed and Sealed this

Twentieth Day of May, 2003

JAMES E. ROGAN
*Director of the United States Patent and Trademark Office*